United States Patent [19]

Ito et al.

[11] Patent Number: 4,816,613
[45] Date of Patent: Mar. 28, 1989

[54] ELECTRICAL SHIELDING CASE

[75] Inventors: Katsuo Ito, Kanazawa; Kazunori Kinoshita, Ishikawa; Kazuhiro Tsuji, Kanazawa, all of Japan

[73] Assignee: Murata Manufacturing Co., Ltd., Kyoto, Japan

[21] Appl. No.: 137,323

[22] Filed: Dec. 23, 1987

[30] Foreign Application Priority Data

Dec. 25, 1987 [JP] Japan .............................. 61-200075

[51] Int. Cl.$^4$ .............................................. H05K 9/00
[52] U.S. Cl. ................................... 174/35 R; 220/22; 220/62
[58] Field of Search ...................... 174/35 R; 361/424; 220/22, 62

[56] References Cited

U.S. PATENT DOCUMENTS

| | | | |
|---|---|---|---|
| 826,464 | 7/1906 | Anthony | 220/62 X |
| 4,370,515 | 1/1983 | Donaldson | 174/35 R |
| 4,628,412 | 12/1986 | Nigorikawa | 174/35 R X |
| 4,747,019 | 5/1988 | Ito et al. | 174/35 R X |
| 4,761,712 | 8/1988 | Ito et al. | 361/417 X |

Primary Examiner—Arthur T. Grimley
Assistant Examiner—David A. Tone
Attorney, Agent, or Firm—Wenderoth, Lind & Ponack

[57] ABSTRACT

An electrical shielding case for shielding a plurality of circuits from each other, which includes a plurality of plate portions formed by dividing a metallic flat plate, and remaining parts of the plate portions left for connection when outer peripheries of the plate portions are cut off, with each of the plate portions being folded at the remaining portions as fulcrums so as to form the electrical shielding case, and is characterized in that there are provided bendable cut and raised portions formed at parts of other confronting plate portions interfering with end faces of the plate portions upon folding thereof.

2 Claims, 7 Drawing Sheets

ELECTRICAL SHIELDING CASE

BACKGROUND OF THE INVENTION

The present invention generally relates to an electrical casing and more particularly, to a shielding case for shielding a plurality of circuits such as high frequency circuits, local oscillation circuits, etc. from each other in a high frequency appliance, for example, an electronic tuner, a CATV (cable television) converter, or the like.

In a high frequency appliance dealing with frequencies higher than VHF or UHF band regions, a shielding case is employed to partition respective circuits for mutually shielding electronic circuits such as a high frequency amplification circuit, local oscillation circuit or the like.

Commonly, as shown in FIG. 10, the shielding case as described above is prepared by forming plate portions 101a to 101d for constituting an outer frame, and plate portions 101e to 101h for partitioning the frame interior on a single metallic flat plate through press work, and bending joint portions of the respective plate portions. As described above, by forming all the plate portions 101a to 101h on the single metallic plate, facilitation of the shielding case forming work and reduction in cost may be achieved.

In the known structure as described above, however, there is such a problem that, during formation of the shielding case as shown in FIGS. 11(A) and 11(B), when both the plate portions 101e and 101f are turned in a direction indicated by an arrow L after causing the plate portion 101f to erect on the plate 101e from the state of the flat plate, the end face of the plate portion 101f interferes with part of the plate portion 101a not folded as yet.

Accordingly, in order to avoid the interference as referred to above, it has been a conventional practice to form a notch 102 at the interfering portion of the plate portion 101a, or to provide notches 103 to 110 in the plate portions 101b to 101e as shown in FIG. 10, thereby to avoid the interference with the end faces of the other plate portions which are to be folded. As described above, in the conventional shielding case, the interference between the plate portions during the folding thereof has been avoided by preliminarily forming notches for facilitation of the shielding case manufacturing work.

However, in the known shielding case as described above, there is a disadvantage that, since part of each plate portion is chipped by the notches formed to avoid the interference between the plate portions during the folding thereof, shielding characteristic for the circuits tends to be deteriorated.

SUMMARY OF THE INVENTION

Accordingly, an essential object of the present invention is to provide an improved shielding case which is capable of maintaining the shielding characteristic for the circuits in a favorable state by arranging so that part of each plate portion constituting the shielding case is not chipped by avoiding the interference between respective plate portions during folding through formation of cut and raised portions.

Another important object of the present invention is to provide a shielding case of the above described type which is simple in construction, and can be readily manufactured at low cost.

In accomplishing these and other objects, according to one preferred embodiment of the present invention, there is provided an electrical shielding case for shielding a plurality of circuits from each other, which includes a plurality of plate portions formed by dividing a single metallic flat plate, and remaining parts of the plate portions left for connection when the outer peripheries of the plate portions are cut off, with each of the plate portions being folded at the remaining portions as fulcrums so as to form the electrical shielding case, and is characterized in that there are provided cut and raised portions formed at parts of other confronting plate portions interfering with end faces of the plate portions upon folding thereof.

By the above arrangement according to the present invention, during folding of the plate portions, if the cut and raised portions provided at portions of other confronting plate portions with which said plate portions interfere, are preliminarily bent, the end faces of the plate portions to be folded do not interfere with the other confronting plate portions. Thus, when the cut and raised portions are returned to the original state after folding of the plate portions, the respective plate portions are brought into the state without chipped portions.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
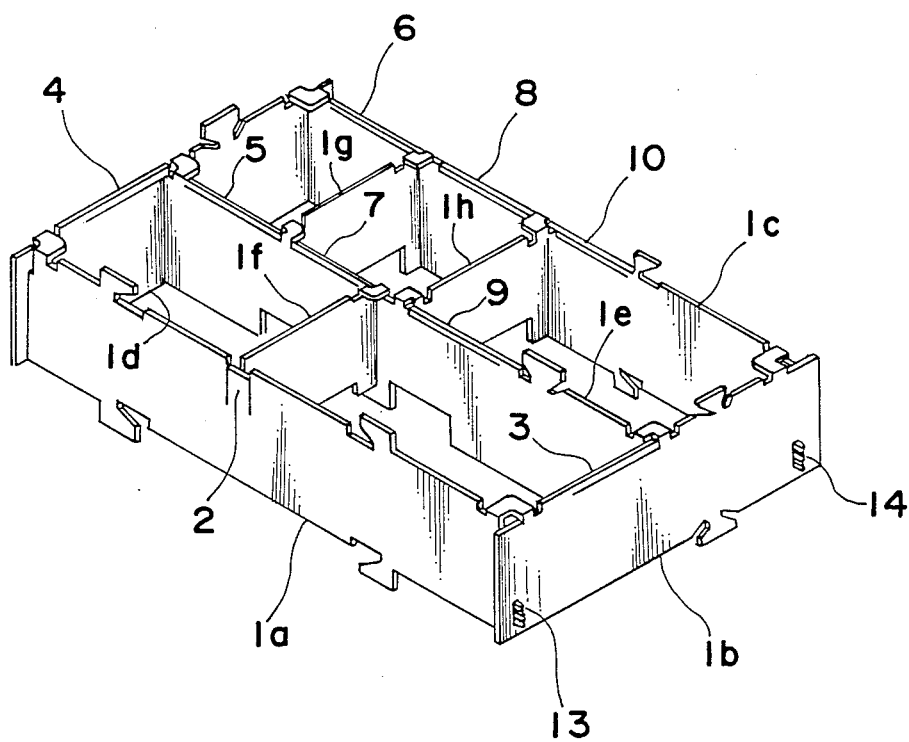
FIG. 1 is a perspective view of a shielding case according to one preferred embodiment of the present invention.

Before the description of the present invention proceeds, it is to be noted that like parts are designated by like reference numerals throughout the accompanying drawings.

Figure 2:
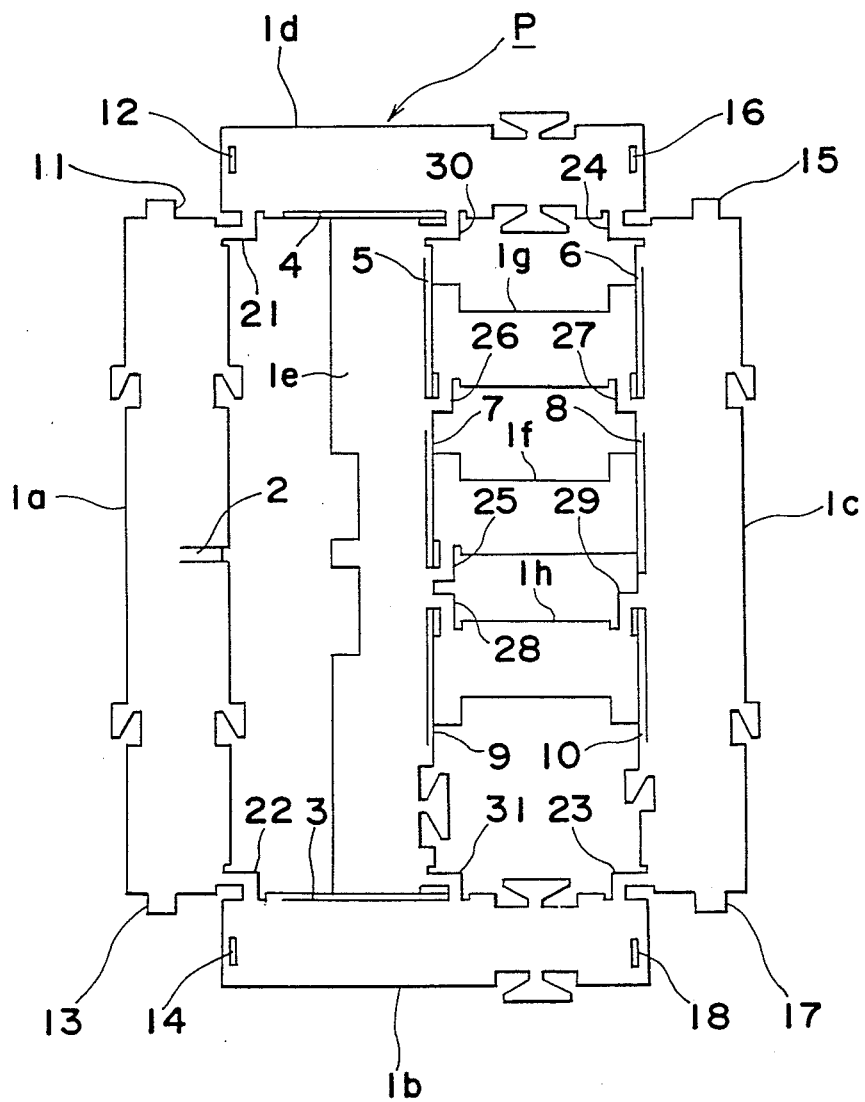
FIG. 2 is a top plan view of the shielding case of FIG. 1 in a flat state before folding.

Referring now to the drawings, there is shown in FIG. 1 an external appearance of a shielding case according to one preferred embodiment of the present invention, with a top plan view thereof in a state of a flat plate before folding being shown in FIG. 2.

In FIG. 2, plate portions 1a, 1b, 1c, 1d, 1e, 1f, 1g and 1h for constituting the shielding case are divided on a single metallic plate P for blanking by press work. During the blanking, the respective plate portions 1a to 1h have parts of outer peripheries thereof left as connecting portions 21, 22, 23, 24, 25, 26, 27, 28, 29, 30 and 31, whereby the plate portions 1a to 1h are connected to each other. For the formation of the shielding case, the plate portions 1a to 1h are bent or folded about the connecting portions 21 to 31 as fulcrums, and thus, the shielding case in the cubic box-like configuration as shown in FIG. 1 is constituted. In the above case, the plate portions 1a to 1d form the outer frame portion of the shielding case, while the plate portions 1e to 1h partition the interior thereof. The plate portions 1a and 1c are respectively formed, at their opposite ends, with projections 11 and 13, and 15 and 17, which are fitted into corresponding holes 14 and 18, and 12 and 16 formed in the plate portions 1b and 1d during formation of the shielding case. After the insertion, the projections 11 and 13, and 15 and 17 are caulked or staked so as to fixedly connect the plate portions 1a to 1d to each other.

Moreover, the plate portion 1a is formed with a cut and raised portion 2, the plate portion 1b, with a cut and raised portion 3, the plate portion 1c, with cut and raised portions 6, 8 and 10, the plate portion 1d with a cut and raised portion 4, and the plate portion 1e, with cut and raised portions 5, 7 and 9, respectively. The portions where these cut and raised portions 2 to 10 are formed are interfering portions with which end or edge faces of the plate portions interfere during folding of other confronting plate portions. Each of the cut and raised portions 2 to 10 is bendably formed on the corresponding plate portion, with a part thereof left as it is connected to the plate portion for bending.

Figure 3A:
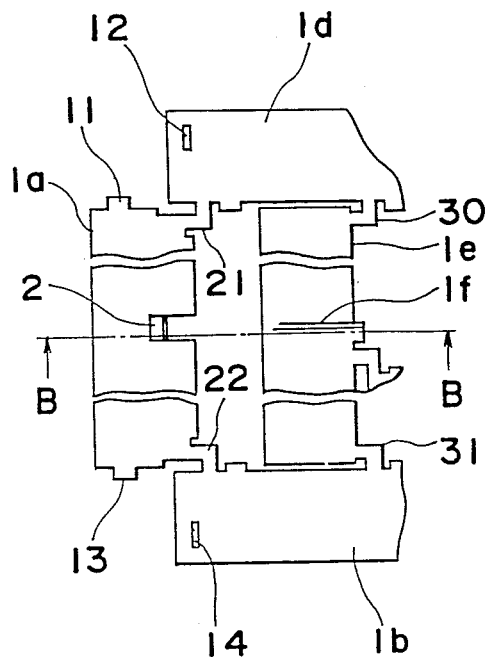
FIGS. 3(A) and 3(B), and 4(A) and 4(B) are fragmentary diagrams showing the folding work at essential portions of the shielding case of FIG. 1.
Figure 4A:
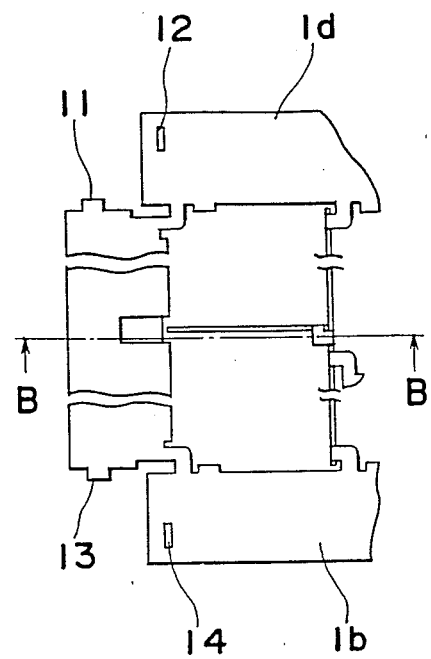
Figure 3B:
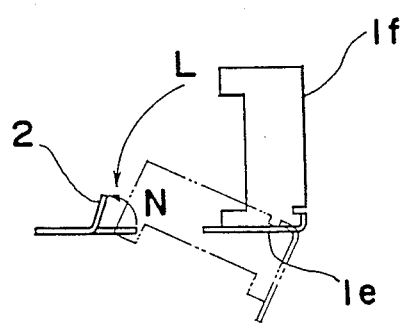
Figure 4B:
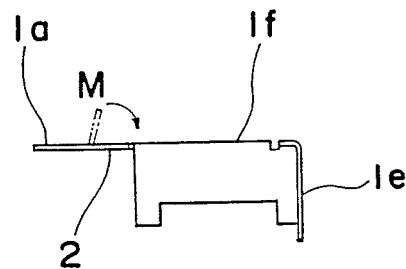
Figure 6A:
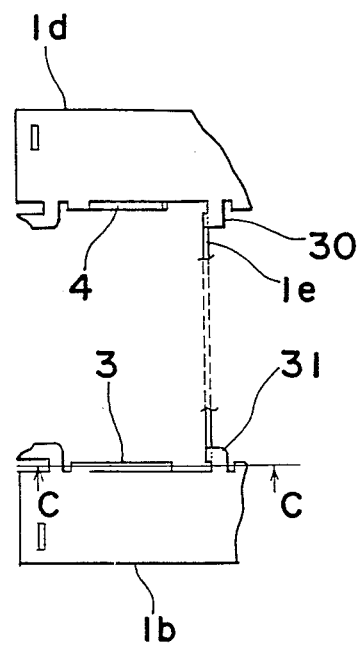

Reference is made to FIGS. 3(A), 3(B), 4(A) and 4(B) showing the state of assembling at essential portions of the shielding case as described so far. It is to be noted that FIGS. 3(A) and 4(A) are top plan views of the portions, while FIGS. 3(B) and 4(B) are views as observed in the direction of the arrows B in FIGS. 3(A) and 4(A), respectively.

In the assembling work of the shielding case, before folding the plate portions 1a and 1e, the plate portion 1f is folded to be erected on the plate portion 1e as shown in FIGS. 3(A) and 3(B). In this case, the cut and raised portion 2 formed on the plate portion 1a is bent in the direction indicated by an arrow N. From the above state, as the plate portion 1e is folded in the direction of an arrow L about the connecting portions 30 and 31 as the fulcrum, the plate portion 1f may be folded to a position shown in FIG. 4(B) through a state indicated by two-dotted lines in FIG. 3(B), without interfering with the other confronting plate portion. Thereafter, when the cut and raised portion 2 is restored in the direction indicated by an arrow M to be flush with the surface of the plate portion 1a, no chipped portion is present in the plate portion 1a.

Reference is also made to FIGS. 5(A), 5(B), 6(A), 6(B), 7(A), 7(B), 8(A) and 8(B), showing the state of assembling at other essential portions of the shielding case. It is to be noted that FIGS. 5(A), 6(A), 7(A), and 8(A) are top plan views of the portions, while FIGS. 5(B), 6(B), 7(B) and 8(B) are views as observed in the direction of the arrows C in FIGS. 5(A), 6(A), 7(A), and 8(A), respectively.

In the case where the plate portion 1e is folded at the connecting portions 3 and 31 as the fulcrum, the opposite end faces of the plate portion 1e interfere with parts of the plate portions 1d and 1b. In the respective plate portions 1d and 1b, the cut and raised portions 3 and 4 are formed at their interfering portions.

Figure 5A:
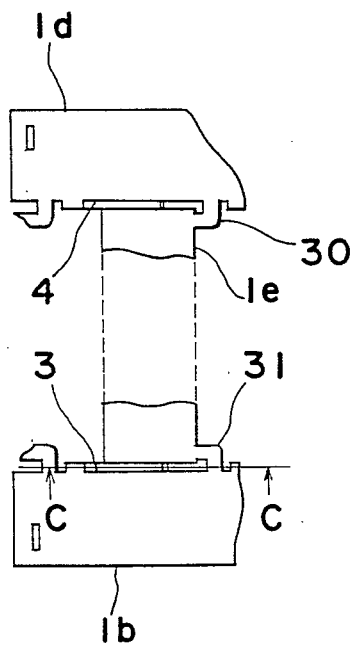
FIGS. 5(A) and 5(B), 6(A) and 6(B), 7(A) and 7(B), and 8(A) and 8(B) are diagrams similar to FIGS. 3 and 4, which particularly show the folding work at other portions thereof.
Figure 5B:
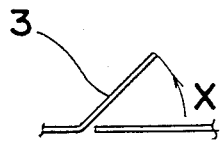
Figure 6B:
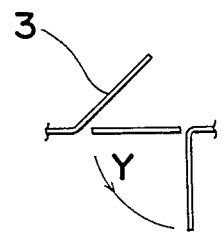
Figure 7A:
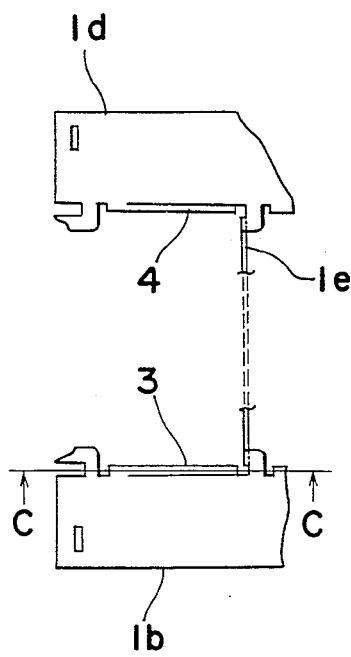
Figure 8A:
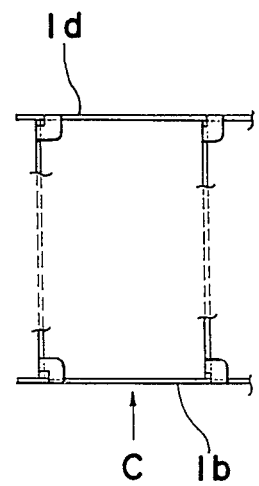
Figure 7B:
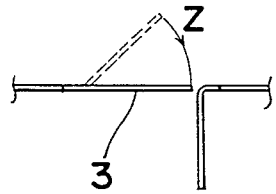
Figure 8B:
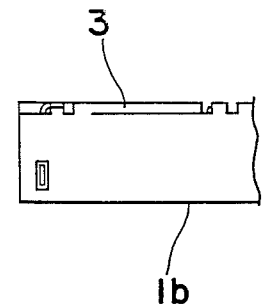

During folding of the plate portion 1e the cut and raised portions 3 and 4 are first bent in a direction indicated by the arrow X as shown in FIG. 5(B), and the plate portion 1e is folded in a direction of the arrow Y as shown in FIG. 6(B), whereby said plate portion 1e interferes with neither the plate portion 1b nor the plate portion 1d. After folding the plate portion 1e, the respective cut and raised portions 3 and 4 are bent in a direction of the arrow Z so as to be flush with the surfaces of the plate portions 1b and 1d as shown in FIG. 7(B), and thus, after formation of the shielding case, the interfering portions of the plate portions 1b and 1d are not chipped as shown in FIG. 8(B).

Similar procedures as described above may apply to the cut and raised portions 5 to 10, and these portions 5 to 10 are preliminarily bent during folding of the plate portions 1f to 1h respectively so that such plate portions 1f to 1h may not interfere with the plate portions 1c and 1e. By restoring the cut and raised portions 5 to 10 after folding of the plate portions 1f to 1h, the interfering portions of the plate portions 1c and 1e are not chipped.

As is seen from the above description, according to the present embodiment, by preliminarily forming the cut and raised portions 2 to 10 at the interfering portions of the respective plate portions, the end faces of the plate portions 1e to 1h do not interfere with the plate portions 1a to 1d during folding of said plate portions 1e to 1h, and thus, facilitation of assembling work may be maintained. Moreover, since the interfering portion of the plate portions 1a to 1e are not chipped after formation of the shielding case, the shielding characteristic is favorably maintained.

Figure 9A:
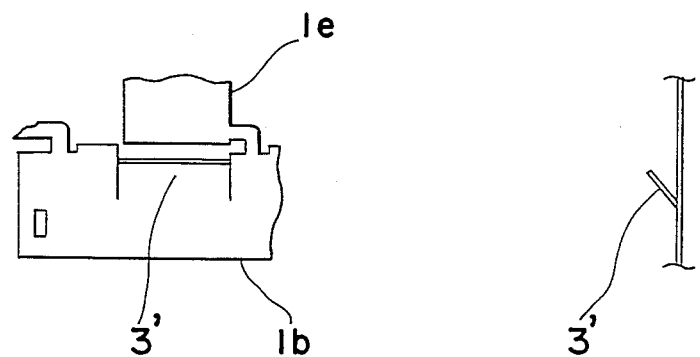
FIG. 9(A) is a fragmentary diagram showing an essential portion of the shielding case according to another embodiment of the present invention.
Figure 9B:
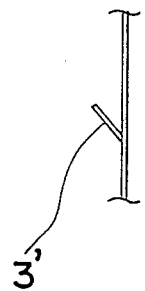
FIG. 9(B) is a side elevational view of the portion of FIG. 9(A)
Figure 10:
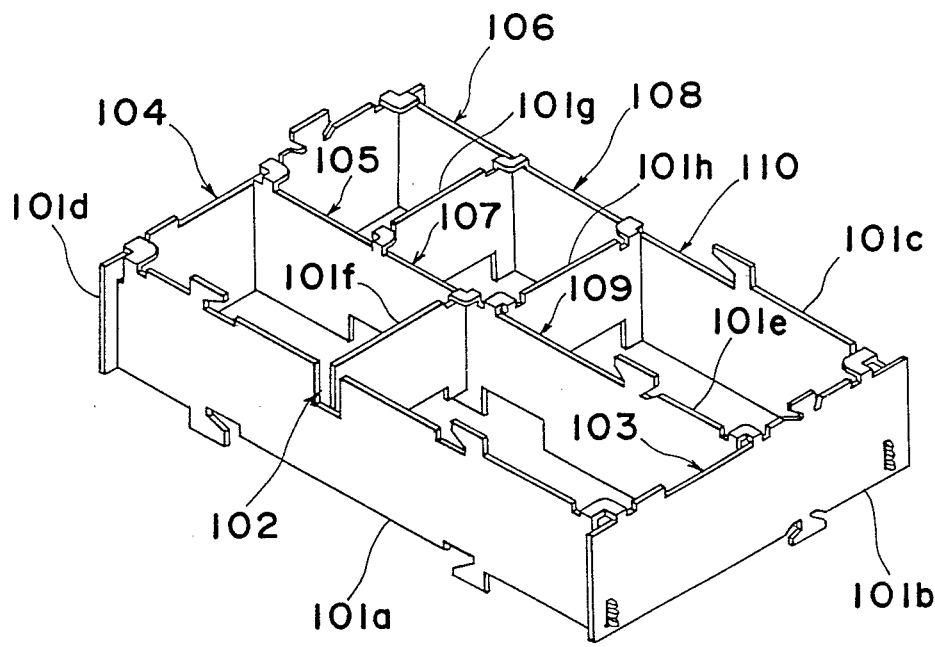
FIG. 10 is a perspective view of a conventional shielding case (already referred to)
Figure 11A:
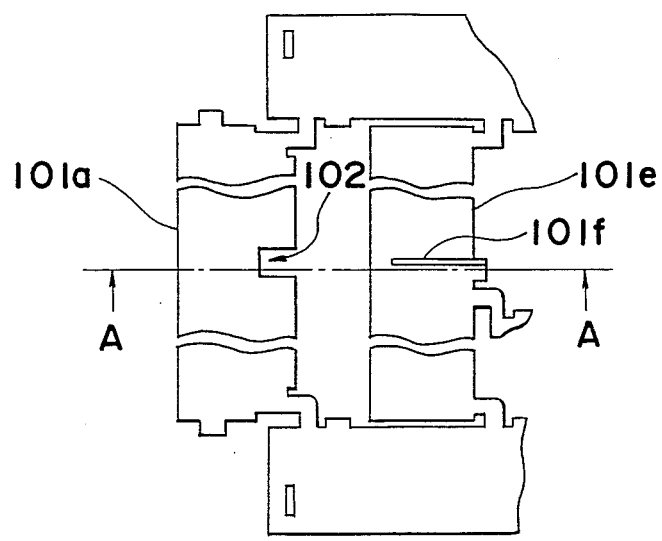
FIGS. 11(A) and 11(B) are fragmentary diagrams showing the folding work at essential portions of the conventional shielding case of FIG. 10 (already referred to).
Figure 11B:
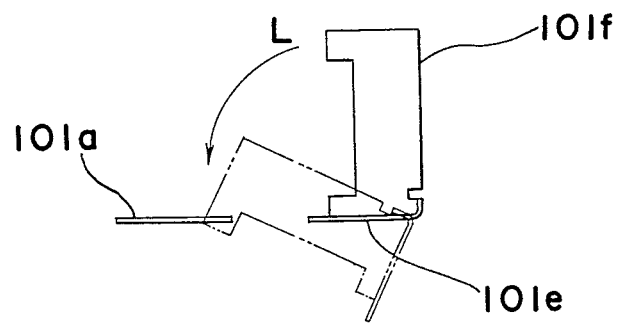

It should be noted here that the cut and raised portions 3 to 10 may be modified in shape as in a portion 3' shown in FIGS. 9(A) or 9(B). Furthermore, if inwardly extending protrusions (not particularly shown) are formed by a drawing process or the like at portions where the inner faces of the plate portions 1a to 1d confront the end faces of the plate portions 1e to 1h, distances between the inner faces of the plate portions 1a to 1d and the corresponding end faces of the plate portions 1e to 1h may be reduced for better sucking up of solder by the capillary action during the solder dipping, and thus, the shielding characteristic can be further improved by completely sealing the contact portions of the respective plate portions.

As is clear from the foregoing description, according to the present invention, during folding of the plate portions of the shielding case, by preliminarily bending the cut and raised portions formed in the other confronting plate portions, the interference by the end faces of the plate portions to be folded, with the interfering portions of the other plate portions can be avoided, while, by restoring the cut and raised portions back to the original state after the plate portions have been folded, chipping at the interfering portions in the other confronting plate portions may be prevented, whereby the shielding characteristic is favorably maintained, with simultaneous facilitation of assembly work.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. In an electrical shielding case for shielding a plurality of circuits from each other, which comprises a plurality of plate portions formed by dividing a metallic flat plate, and remaining parts of the plate portions left for connection when outer peripheries of said plate portions are cut off, each of said plate portions being folded at said remaining portions as fulcrums so as to form said electrical shielding case, the improvement comprising cut and raised portions bendably formed at parts of other confronting plate portions interfering with end faces of said plate portions upon folding thereof.

2. A method of manufacturing an electrical shielding case which comprises the steps of forming a plurality of plate portions by dividing a metallic flat plate, cutting off outer peripheries of said plate portions, with remaining parts of said plate portions being left for connection, and folding each of said plate portions at said remaining portions as fulcrums so as to form said electrical shielding case, with bendable cut and raised portions being formed at parts of other confronting plate portions interfering with end faces of said plate portions upon folding thereof.

* * * * *